United States Patent
Chuang et al.

(10) Patent No.: US 8,854,897 B2
(45) Date of Patent: Oct. 7, 2014

(54) STATIC RANDOM ACCESS MEMORY APPARATUS AND BIT-LINE VOLTAGE CONTROLLER THEREOF

(71) Applicants: Ching-Te Chuang, New Taipei (TW); Nan-Chun Lien, Taipei (TW); Wei-Nan Liao, Taichung (TW); Chi-Hsin Chang, Taichung (TW); Hao-I Yang, Taipei (TW); Wei Hwang, Hsinchu (TW); Ming-Hsien Tu, Hsinchu (TW)

(72) Inventors: Ching-Te Chuang, New Taipei (TW); Nan-Chun Lien, Taipei (TW); Wei-Nan Liao, Taichung (TW); Chi-Hsin Chang, Taichung (TW); Hao-I Yang, Taipei (TW); Wei Hwang, Hsinchu (TW); Ming-Hsien Tu, Hsinchu (TW)

(73) Assignees: Faraday Technology Corp., Science-Based Industrial Park, Hsin-Chu (TW); National Chiao Tung University, Hsinchu (TW)

( * ) Notice: Subject to any disclaimer, the term of this patent is extended or adjusted under 35 U.S.C. 154(b) by 161 days.

(21) Appl. No.: 13/665,941

(22) Filed: Nov. 1, 2012

(65) Prior Publication Data

US 2014/0009999 A1 Jan. 9, 2014

(30) Foreign Application Priority Data

Jul. 9, 2012 (TW) .............................. 101124623 A

(51) Int. Cl.
*G11C 7/10* (2006.01)

(52) U.S. Cl.
USPC ................ 365/189.02; 365/49.1; 365/189.05; 365/189.11; 365/194

(58) Field of Classification Search
CPC ...... G11C 11/5628; G11C 16/26; G11C 7/22; G11C 11/5642; G11C 16/28; G11C 7/08; G11C 8/08; G11C 8/10; G11C 11/00; G11C 5/06

USPC ............ 365/189.05, 189.03, 189.15, 189.14, 365/189.16, 49.1, 49.15, 189.09, 189.12, 365/189.02, 194, 205, 207, 210.11, 210.12, 365/233.11

See application file for complete search history.

(56) References Cited

U.S. PATENT DOCUMENTS

| | | | |
|---|---|---|---|
| 5,946,251 A | 8/1999 | Sato et al. | |
| 6,075,729 A | 6/2000 | Ohhata et al. | |
| 6,144,600 A | 11/2000 | Ogura | |
| 2002/0149974 A1* | 10/2002 | Sato et al. | 365/189.11 |
| 2003/0090951 A1* | 5/2003 | Yokozeki | 365/230.03 |
| 2008/0137440 A1* | 6/2008 | Liaw | 365/189.04 |

OTHER PUBLICATIONS

Juergen Pille et al., "A 32kB 2R/1W L1 Data Cache in 45nm SOI Technology for the POWER7(TM) Processor", 2010 IEEE International Solid-State Circuits Conference, Feb. 2010, p. 344-346.

(Continued)

*Primary Examiner* — Hien Nguyen
(74) *Attorney, Agent, or Firm* — Winston Hsu; Scott Margo

(57) ABSTRACT

A static random access memory apparatus and a bit-line voltage controller includes a controller, a pull-up circuit, a pull-down circuit and a voltage keeping circuit. The controller receives a bank selecting signal and a clock signal, and decides a pull-up time period, a pull-down time period and a voltage keeping time period according to the bank selecting signal and the clock signal. The pull-up circuit pulls up a bit-line power according to a first reference voltage within the pull-up time period. The pull-down circuit pulls down the bit-line power according to a second reference voltage within the pull-down time period. The voltage keeping circuit keeps the bit-line power to equal to an output voltage during the voltage keeping time period. The voltage keeping time period is after the pull-up time period and the pull-down time period.

19 Claims, 18 Drawing Sheets

(56) References Cited

OTHER PUBLICATIONS

Harold Pilo et al., "A 64Mb SRAM in 32nm High-k Metal-Gate SOI Technolog with 0.7V Operation Enabled by Stability, Write-Ability and Read-Ability Enhancements", 2011 IEEE International Solid-State Circuits Conference, Feb. 2011, p. 254-256.

D.W. Plass et al., "IBM POWER6 SRAM arrays", IBM J. Res. & Dev. vol. 51 No. 6, Nov. 2007, p. 747-756.

* cited by examiner

STATIC RANDOM ACCESS MEMORY APPARATUS AND BIT-LINE VOLTAGE CONTROLLER THEREOF

CROSS-REFERENCE TO RELATED APPLICATION

This application claims the priority benefit of Taiwan application serial no. 101124623, filed on Jul. 9, 2012. The entirety of the above-mentioned patent application is hereby incorporated by reference herein and made a part of this specification.

BACKGROUND OF THE INVENTION

1. Field of the Invention

The present invention is related to a static random access memory apparatus, and more particularly, a static random access memory apparatus having a bit-line under drive (BLUD) mechanism.

2. Description of Related Art

According to conventional arts, a Static Random Access Memory (SRAM, such as a static random access memory having a plurality of memory cells in 6T structure) usually have a read disturb problem. The read disturb problem seriously affects the stability of data reading of the SRAM.

Along with the improvement in the semiconductor fabrication, the size of the electronic components in the SRAM is getting smaller, and the operation voltage decreases as well. In light of the reason above, the read disturb problem of the SRAM of the conventional art also becomes an important topic. According to conventional art, a bit-line under drive or a word-line under drive has been mentioned to enhance the stability of the reading of SRAM. However, when a fabrication variation occurs, the topic of keeping sufficient read stability for the SRAM is still a topic for people in the art to strive for.

SUMMARY OF THE INVENTION

The embodiment of the present invention provides a bit-line voltage controller, which reduces the variation of a bit-line power due to the fabrication variation.

The embodiment of the present invention provides a static random access memory apparatus, which reduces the variation of a bit-line power due to the fabrication variation, and effectively enhances the rate of data sensing.

The embodiment of the present invention provides a bit-line voltage controller, adapted to a static random access memory apparatus. The bit-line voltage controller includes a controller, a voltage pull-up circuit, a voltage pull-down circuit, and a voltage keeping circuit. A controller receives a bank selecting signal and a clock signal, and decides a pull-up time period, a pull-down time period, and a voltage keeping time period according to the bank selecting signal and the clock signal. The voltage pull-up circuit is coupled to the controller, and pulls up a bit-line power according to a first reference voltage within the pull-up time period. The voltage pull-down circuit is coupled to the controller, and pulls down the bit-line power according to a second reference voltage within the pull-down time period. The voltage keeping circuit is coupled to the controller, and the voltage keeping circuit keeps the bit-line voltage to equal to an output voltage during the voltage keeping time period. Wherein, the voltage keeping time period is after the pull-up time period and the pull-down time period.

The embodiment of the present invention provides another static random access memory apparatus, which includes a memory cell array, a bit-line multiplexer, a sensing circuit, and a bit-line voltage controller. The memory cell array has a plurality of bit-lines. The bit-line multiplexer is coupled to the memory cell array. The bit-line multiplexer receives a bit-line power, and selects a plurality of selected bit-line pairs out of the bit-lines. The sensing circuit is coupled to the bit-line multiplexer, which senses data of each of the selected bit-line pairs so as to generate readout data. A bit-line voltage controller is coupled to the bit-line multiplexer, which is configured to provide the bit-line power. The bit-line voltage controller includes a controller, a voltage pull-up circuit, a voltage pull-down circuit, and a voltage keeping circuit. The controller receives a bank selecting signal and a clock signal, and decides a pull-up time period, a pull-down time period, and a voltage keeping time period according to the bank selecting signal and the clock signal. The voltage pull-up circuit is coupled to the controller and pulls up the bit-line power according to a first reference voltage within the pull-up time period. The voltage pull-down circuit is coupled to the controller, and pulls down the bit-line power according to the second reference voltage with the pull-down time period. The voltage keeping circuit is coupled to the controller, and the voltage keeping circuit keeps the bit-line power to equal to an output voltage at the voltage keeping time period. Wherein, the voltage keeping time period is after the pull-up time period and the pull-down time period.

Base on the above, the embodiment of the present invention provides the bit-line voltage controller through pulling up and pulling down the bit-line power within the pull-up time period and the pull-down time period respectively, and then keeping the voltage level of the bit-line power at the voltage keeping time period. As a result, the effect of a draft, a characteristic of the electronic device due to the fabrication variation, can be reduced effectively. The stability of the static random access memory apparatus can be enhanced effectively.

In order to make the aforementioned and other features and advantages of the invention comprehensible, several exemplary implementations accompanied with figures are described in detail below.

DESCRIPTION OF THE EMBODIMENTS

Figure 1:
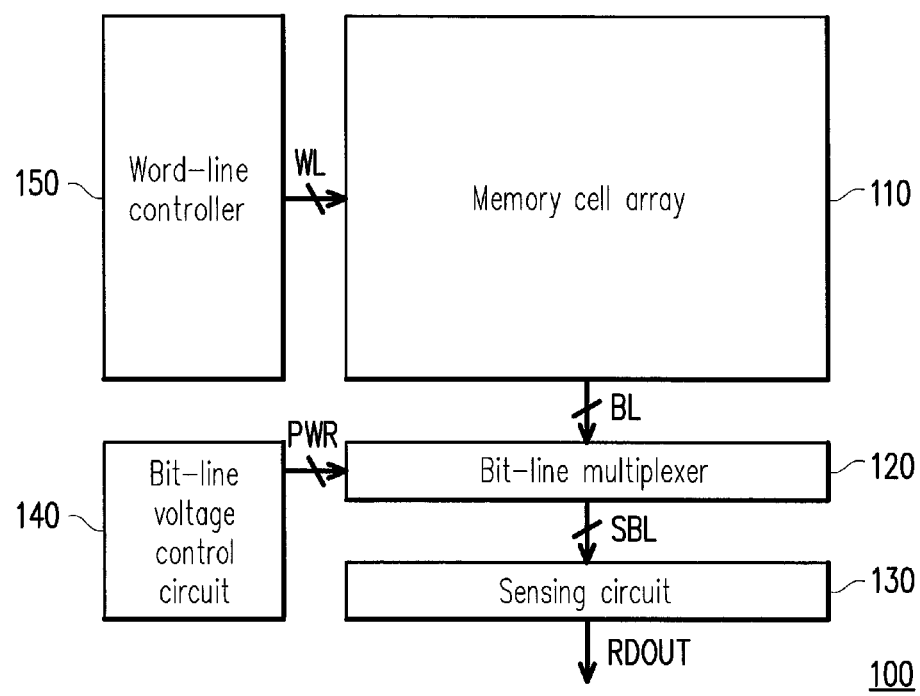
FIG. 1 is a diagram illustrating a static random access memory apparatus 100 according to the exemplary embodiment of the present invention.

Referring to FIG. 1, FIG. 1 is a diagram illustrating a static random access memory apparatus 100 according to the exemplary embodiment of the present invention. The static random access memory apparatus 100 includes a memory cell array 110, a bit-line multiplexer 120, a sensing circuit 130, a bit-line voltage controller 140, and a word-line controller 150. The memory cell array 110 includes a plurality of memory cells, and having a plurality of bit-lines BL and a plurality of word-lines WL. The memory cell array 110 is coupled to the bit-line multiplexer 120 through the bit-line BL, and coupled to the word-line controller 150 through the word-lines WL. Wherein, the word-line controller 150 is configured to provide a word-line signal on the word-line WL.

The bit-line multiplexer 120 is also coupled to the bit-line voltage controller 140 for receiving a bit-line power PWR. The bit-line multiplexer 120 selects a plurality of selected bit-line pairs SBL out of the bit-lines BL. Wherein, each of the bit-line pairs has two bit-lines. The two bit-lines may be configured to transmit two bit-line signals having complementary phases.

The sensing circuit 130 is coupled to the bit-line multiplexer 120 by the selected bit-line pairs SBL. The sensing circuit 130 senses data on each of the selected bit-line pairs SBL so as to generate a readout data RDOUT accordingly.

The bit-line voltage controller 140 is configured to generate a bit-line power PWR, and the bit-line power PWR is transmitted to the bit-line multiplexer 120 as a power for the bit-line multiplexer 120 to pre-charge the selected bit-line SBL. In the present embodiment, the effect on the bit-line power PWR generated by the bit-line voltage controller 140 due to the fabrication parameter variation may be restrained effectively.

Figure 2:
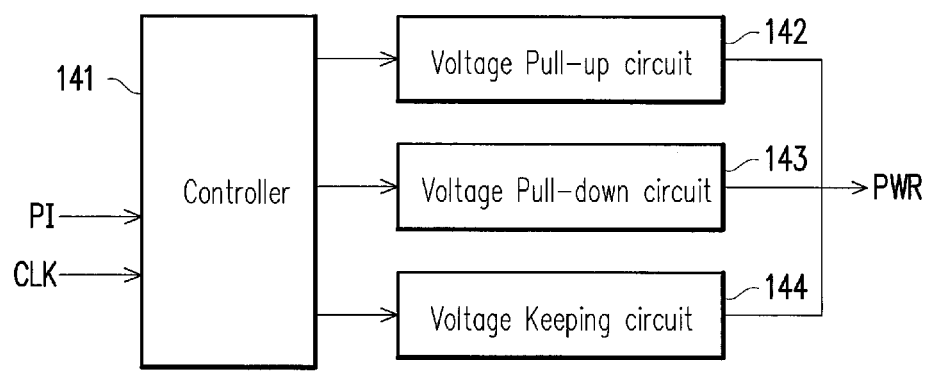
FIG. 2 is a diagram illustrating the implementation of a bit-line voltage controller 140 according to the exemplary embodiment of the present invention.

Referring to FIG. 2 for the implementation details of the bit-line voltage controller 140. FIG. 2 is a diagram illustrating an implementation of the bit-line voltage controller 140 according to the exemplary embodiment of the present invention. The bit-line voltage controller 140 includes a controller 141, a voltage pull-up circuit 142, a voltage pull-down circuit 143, and a voltage keeping circuit 144. The controller 141 receives a bank selecting signal PI and a clock signal CLK. The controller 141 decides a pull-up time period, a pull-down time period, and a voltage keeping time period according to the bank selecting signal PI and the clock signal CLK. Wherein, the pull-up time period may occur before the pull-down time period, or the pull-up time period may also occur after the pull-down time period. It should be noted that the voltage keeping time period must occur after the pull-up time period and pull-down time period.

The voltage pull-up circuit 142 is coupled to the controller 141, and the voltage pull-up circuit 142 is configured to pull up the bit-line power PWR during the pull-up time period according to a first reference voltage. Similarly, the voltage pull-down circuit 143 is coupled to the controller 141. During the pull-down time period, the voltage pull-down circuit 143 is configured to pull down the bit-line power PWR according to a second reference voltage. Wherein, the first reference voltage is greater than the second reference voltage. The voltage keeping circuit 144 is coupled to the controller 141, and the voltage keeping circuit 144 keeps the bit-line voltage PWR at a voltage value equal to an output voltage.

Specifically, when the bank selecting signal PI received by the bit-line voltage controller 140 is enabled (indicating that the bank corresponding to the bit-line voltage controller 140 is to be read), a time period while the bank selecting signal PI is enabled can be divided into the pull-up time period, the pull-down time period, and the voltage keeping time period. For example, when a period of time while the bank selecting signal PI is enabled equals to a clock cycle of the clock signal CLK, the pull-up time period, the pull-down time period, and the voltage keeping time period can be allocated within a first half of the clock cycle of the clock signal CLK.

During the pull-up time period, the bit-line voltage controller 140 can first pull up the bit-line power PWR by the voltage pull-up circuit 142 according to the first reference voltage. Next, the bit-line power PWR is pulled down during the pull-down time period by the voltage pull-down circuit 143 according to the second reference voltage. Wherein, the first reference voltage may be an operation voltage received by the bit-line voltage controller 140, and the second reference voltage may be a ground voltage received by the bit-line voltage controller 140. Then, the bit-line voltage controller 140 keeps the bit-line power PWR equal to the output voltage during the voltage keeping time period by the voltage keeping circuit 144.

It should be noted that the order of pulling up and pulling down of the bit-line power PWR of the aforementioned bit-line voltage controller 140 are interchangeable. It is not limited to pull down the bit-line power PWR first.

Figure 3A:
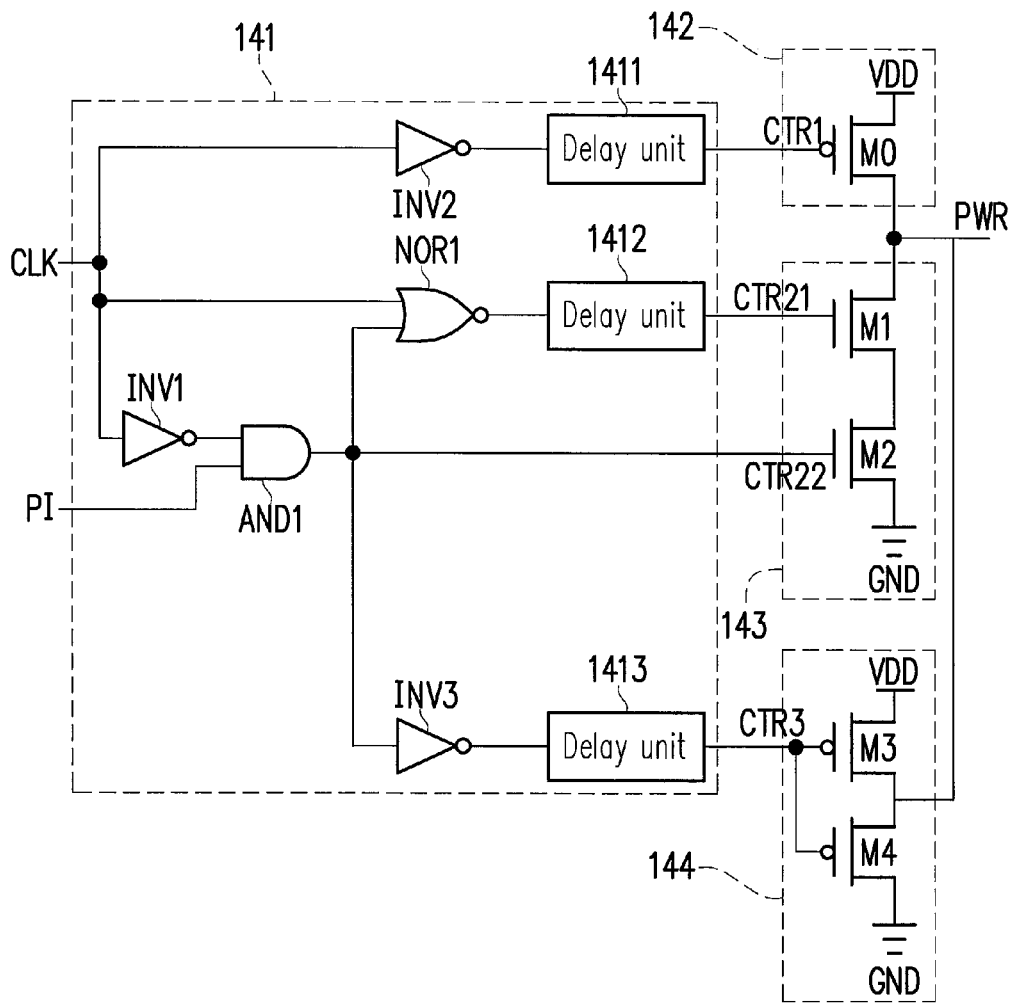
FIG. 3A is a circuit diagram illustrating a first implementation of the bit-line voltage controller 140 according to the embodiment of the present embodiment.

Referring to FIG. 3A, FIG. 3A is a circuit diagram illustrating a first implementation of the bit-line voltage controller 140 according to the embodiment of the present embodiment. Wherein, the voltage pull-up circuit 142 is constructed by a pull-up transistor M0, the voltage pull-down circuit 143 is constructed by two pull-down transistors M1 and M2, and the voltage keeping circuit 144 is constructed by two transistors M3 and M4. A first terminal of the pull-up transistor M0 receives the first reference voltage (e.g. operation voltage VDD), a control terminal of the pull-up transistor M0 receives a control signal CTRL, and a second terminal of the pull-up transistor M0 is coupled to the bit-line power PWR. A control terminal of the pull-down transistor M1 receives a control signal CTR21, a first terminal of the pull-down transistor M1 is coupled to the bit-line power PWR, and a second terminal of the pull-down transistor M1 and a first terminal of the pull-down transistor M2 are coupled to each other. A second terminal of the pull-down transistor M2 is coupled to the second reference voltage (e.g. ground voltage GND), and a control terminal of the pull-down transistor M2 receives a control signal CTR22. Furthermore, in the voltage keeping circuit 144, a control terminal of the transistor M3 and a control terminal of the transistor M4 both receive a control signal CTR3, a first terminal of the transistor M3 is coupled to the operation voltage VDD, a second terminal of the transistor M3 and a first terminal of the transistor M4 are coupled to each other, and a second terminal of the transistor M4 is coupled to the ground voltage GND.

The control signals CTR1, CTR21, CTR22 and CTR3 are generated respectively in response to the pull-up time period, the pull-down time period and the voltage keeping time period.

In the present implementation, the controller 141 includes three inverters INV1-INV3, an AND gate AND1, a NOR gate NOR1 and three delay units 1411-1413. The inverter INV1 receives the clock signal CLK, and an output terminal of the inverter INV1 is coupled to a first input terminal of the AND gate AND 1. A second input terminal of the AND gate AND1 receives the bank selecting signal PI, and an output terminal of the AND gate AND1 generates a bit (the control signal CTR22) of the control signal. The inverter INV2 also receives the clock signal CLK, and an output terminal of the inverter INV2 is coupled to an input terminal of the delay unit 1411, and an output terminal of the delay unit 1411 generates the control signal CTR1. A first input terminal of the NOR gate NOR1 is coupled to the output terminal of the AND gate AND1, and a second input terminal of the NOR gate NOR1 receives the clock signal CLK. An output terminal of the NOR gate NOR1 is coupled to an input terminal of the delay unit 1412, and an output terminal of the delay unit 1412 generates another bit (the control signal CTR21) of the control signal. The inverter INV3 and the delay unit 1413 are connected serially in a sequence between the output terminal of the AND gate AND1 and the voltage keeping circuit 144. An output terminal of the delay unit 1413 generates the control signal CTR3.

Figure 3B:
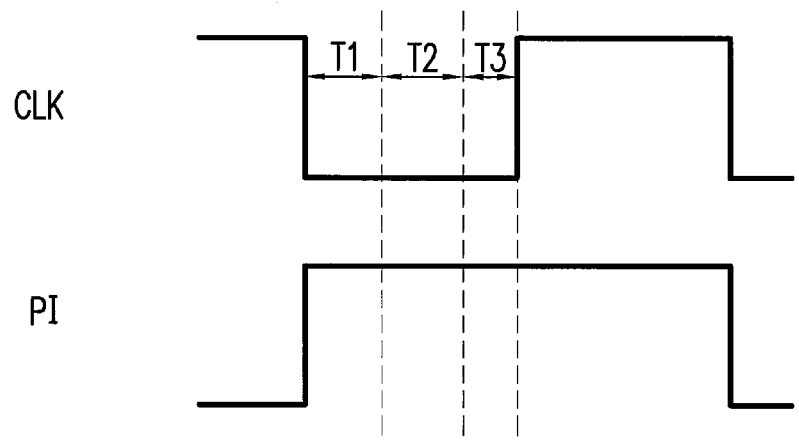
FIG. 3B is a waveform diagram illustrating a bank selecting signal PI and a clock signal CLK.

Referring to FIGS. 3A and 3B for details on the operation of the bit-line voltage controller 140. FIG. 3B is a waveform diagram illustrating the bank selecting signal PI and the clock signal CLK. Wherein, at the moment when the clock signal CLK switches to the logic low voltage level from the logic high voltage level (between a pull-up time period T1), the pull-up transistor M0 is turned on and the bit-line power PWR is pulled up to the operation voltage VDD. Wherein, the length of the pull-up time period T1 may be decided by a delay provided by the delay unit 1411 and the inverter INV2. Furthermore, the AND gate AND1, the inverter INV1 and the NOR gate NOR1 forms a one shot circuit, and a positive voltage pulse is generated according to the change of state of the clock signal CLK from the logic high voltage level to the logic low voltage level. The delay unit 1412 further delays the positive voltage pulse to generate the control signal CTR 21, so as to turn on the transistor M1. A pulse width of the control signal CTR21 may equal to a width of the pull-down time period T2. In addition, during the pull-down period T2, the pull-down transistors M1 and M2 are turned on simultaneously (pull-up transistor M1 is turned off), and the bit-line power PWR is pulled down (e.g. pulled down to 30% of the operation voltage VDD) according to the ground voltage.

The output of the inverter INV3 is delayed by the delay unit 1413. While pull-up transistors M1 and M2 are turned off, the delay unit 1413 provides the control signal CTR3, as to turn on the transistors M3 and M4 to keep the voltage level of the bit-line power PWR.

In the present embodiment, since amount of the bit-line power PWR that is to be pulled down is decided by the time which the pull-down transistors M1 and M2 are turned on simultaneously. When the fabrication parameter drift to a N-type transistor having a stronger current draining ability, the turn on time of the pull-down transistors M1 and M2 become relatively short, wherein the pull-down transistors M1 and M2 are turned on according to the control signals CTR21 and CTR22 having logic high voltage level. On the contrary, when the fabrication parameter drift to a N-type transistor having a weaker current draining ability, the turn on time of the pull-down transistor M1 and M2 become relatively long, wherein the pull-down transistors M1 and M2 are turned on according to the control signals CTR21 and CTR 22 having the logic high voltage level. Therefore, the amount of the bit-line power PWR that is pulled down may be controlled with stability within a range rather than generating a huge variation due to the fabrication variation.

Additionally, the transistors M0, M3 and M4 are P-type transistors and the transistors M1 and M2 are N-type transistors in the present implementation.

Figure 3C:
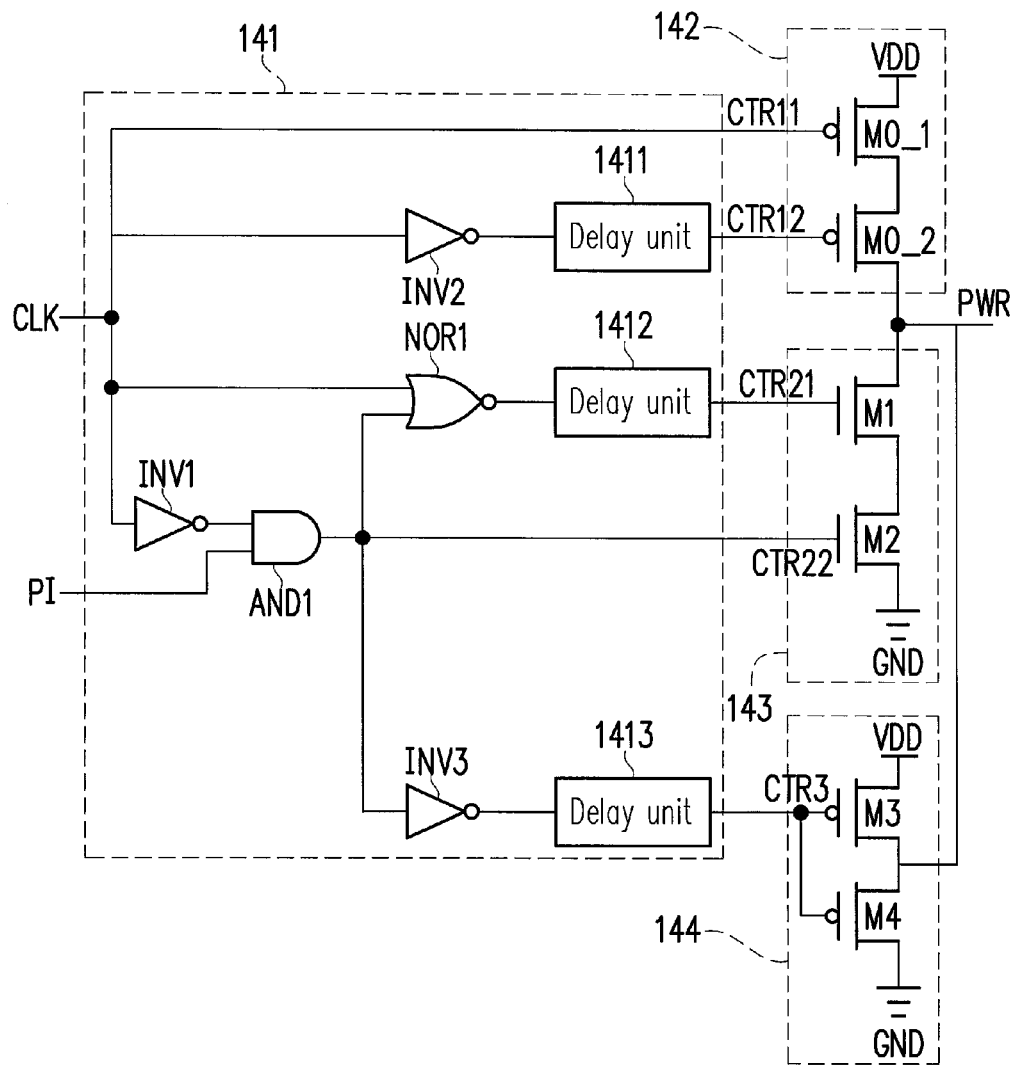
FIG. 3C is a circuit diagram illustrating a second implementation of the bit-line voltage controller 140 according to the exemplary embodiment of the present invention.

Referring to FIG. 3C, FIG. 3C is a circuit diagram illustrating a second implementation of the bit-line voltage controller 140 according to the exemplary embodiment of the present invention. The difference between the second implementation and the implementation previously mentioned is that the voltage pull-up circuit 142 of the present implementation includes two transistors M0_1 and M0_2. Wherein, a control terminal of the transistor M0_1 receives the clock signal CLK directly as a control signal CTR11, a control terminal of the transistor M0_2 receives a signal on the output terminal of the delay unit 1411 as a control signal CTR12. The detail on the operation of the present implementation is similar to the previous implementation, it is omitted here.

Figure 3D:
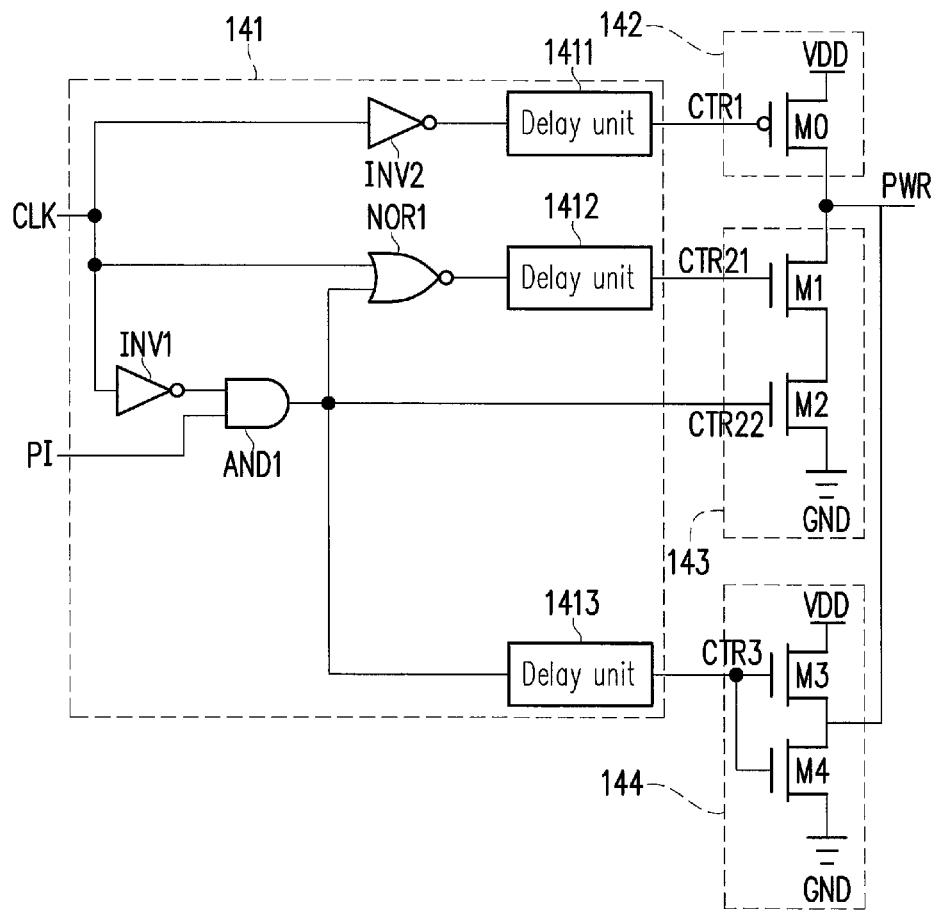
FIG. 3D is a circuit diagram illustrating a third implementation of the bit-line voltage controller 140 according to the exemplary embodiment of the present invention.

Referring to FIG. 3D, FIG. 3D is a circuit diagram illustrating a third implementation of the bit-line voltage controller 140 according to the exemplary embodiment of the present invention. The difference between the bit-line voltage controller 140 in the first implementation and the third implementation is that the transistors M3 and M4 of the voltage keeping circuit 144 are N-type transistors in the present implementation. The input terminal of the delay unit 1413 is coupled to the output terminal of the AND gate AND1 directly, and the output terminal of the delay unit 1413 provides the control signal CTR3 to the control terminal of the transistors M3 and M4 directly.

Figure 3E:
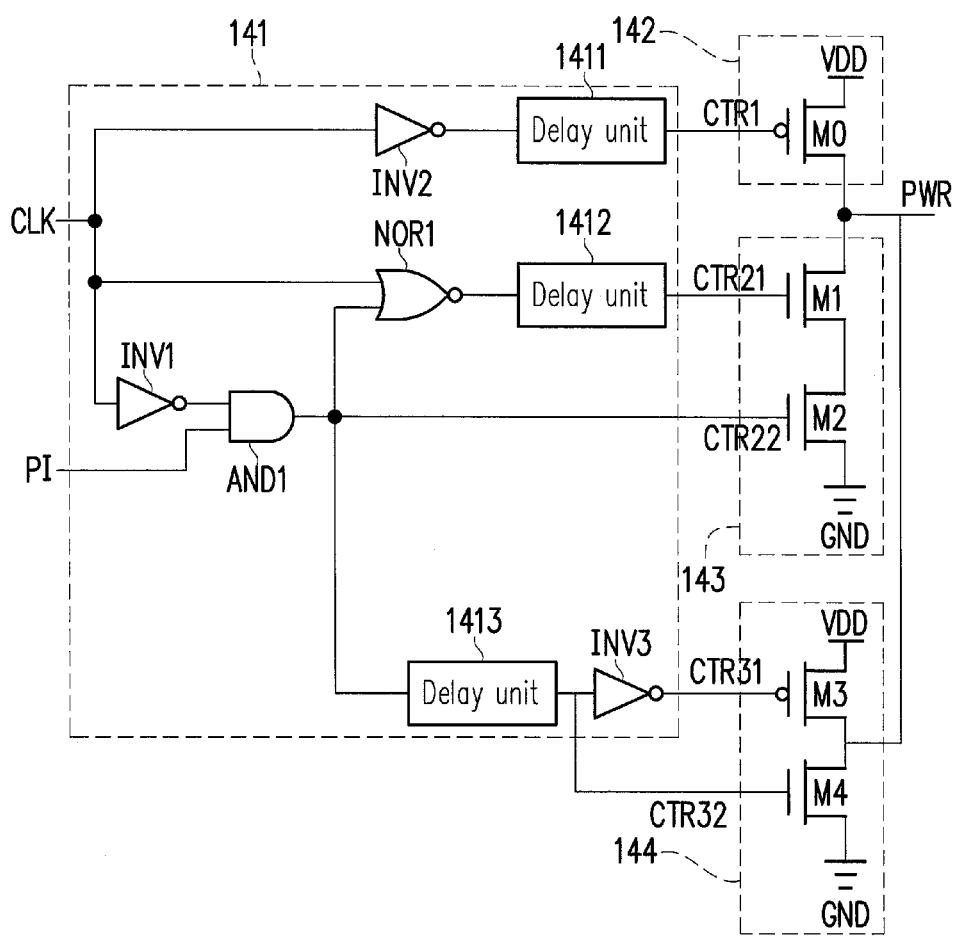
FIG. 3E is a circuit diagram illustrating a fourth implementation of the bit-line voltage controller 140 according to the exemplary embodiment of the present invention.

Referring to FIG. 3E, FIG. 3E is a circuit diagram illustrating a fourth implementation of the bit-line voltage controller 140 according to the exemplary embodiment of the present invention. The difference in the bit-line voltage controller 140 between the first implementation and the present implementation is that, in the present implementation, the transistor M3 of the voltage keeping circuit 144 is a P-type transistor and the transistor M4 of the voltage keeping circuit 144 is a N-type transistor. Correspondingly, the input terminal of the delay unit 1413 is directly coupled to the output terminal of the AND gate AND1, and the output terminal of the delay unit 1413 provides directly the control signal CTR 32 to the control terminal of the transistor M4. Furthermore, the inverter INV3 is connected in series between the output terminal of the delay unit 1413 and the control terminal of the transistor M3, and the output terminal of the delay unit 1413 generates the control signal CTR31.

Figure 3F:
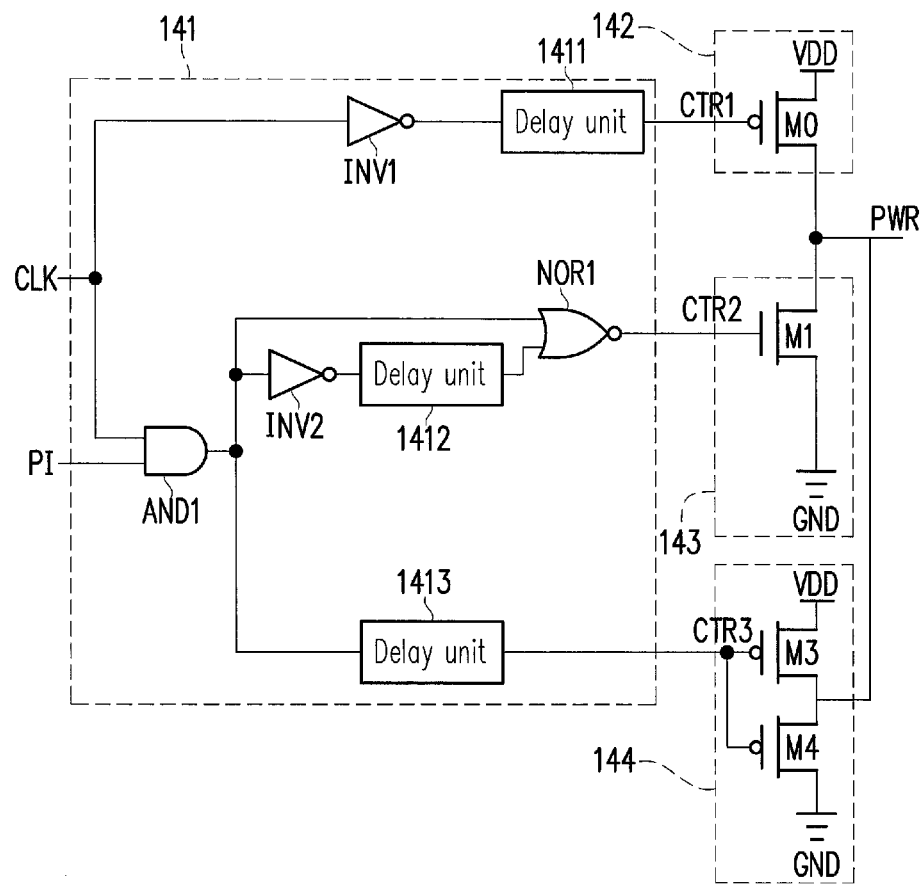
FIG. 3F is a circuit diagram illustrating a fifth implementation of the bit-line voltage controller 140 according to the exemplary embodiment of the present invention.

Referring FIG. 3F, FIG. 3F is a circuit diagram illustrating a fifth implementation of the bit-line voltage controller 140 according to the exemplary embodiment of the present invention. In the present implementation, the voltage pull-up circuit 142 is constructed by a transistor M0, the voltage pull-down circuit 143 is constructed by a single transistor M1, and the voltage keeping circuit 144 is constructed by two P-type transistors M3 and M4. Correspondingly, the controller 141 of the present implementation includes two inverters INV1 and INV2, a NOR gate NOR1, an AND gate AND1 and three delay units 1411-1413. An input terminal of the inverter INV1 receives a clock pulse CLK, an output terminal of the inverter INV1 is coupled to an output terminal of the delay unit 1411, and an output terminal of the delay unit 1411 generates a control signal CTR1. Two input terminals of the AND gate AND1 receives a clock signal CLK and a bank selecting signal PI respectively. An input terminal of the inverter INV2 is coupled to an output terminal of the AND gate AND1, an output terminal of the inverter INV2 is coupled to an input terminal of the delay unit 1412. Two input terminals of the NOR gate NOR1 are coupled to an output terminal of the delay unit 1412 and the output terminal of the AND gate AND1 respectively, an output terminal of the NOR gate NOR1 generates a control signal CTR2. Wherein, the NOR gate NOR1, the delay unit 1412 and the inverter INV2 forms a one shot circuit, which is configured to generate a control signal CTR2 as a positive pulse signal.

Figure 3G:
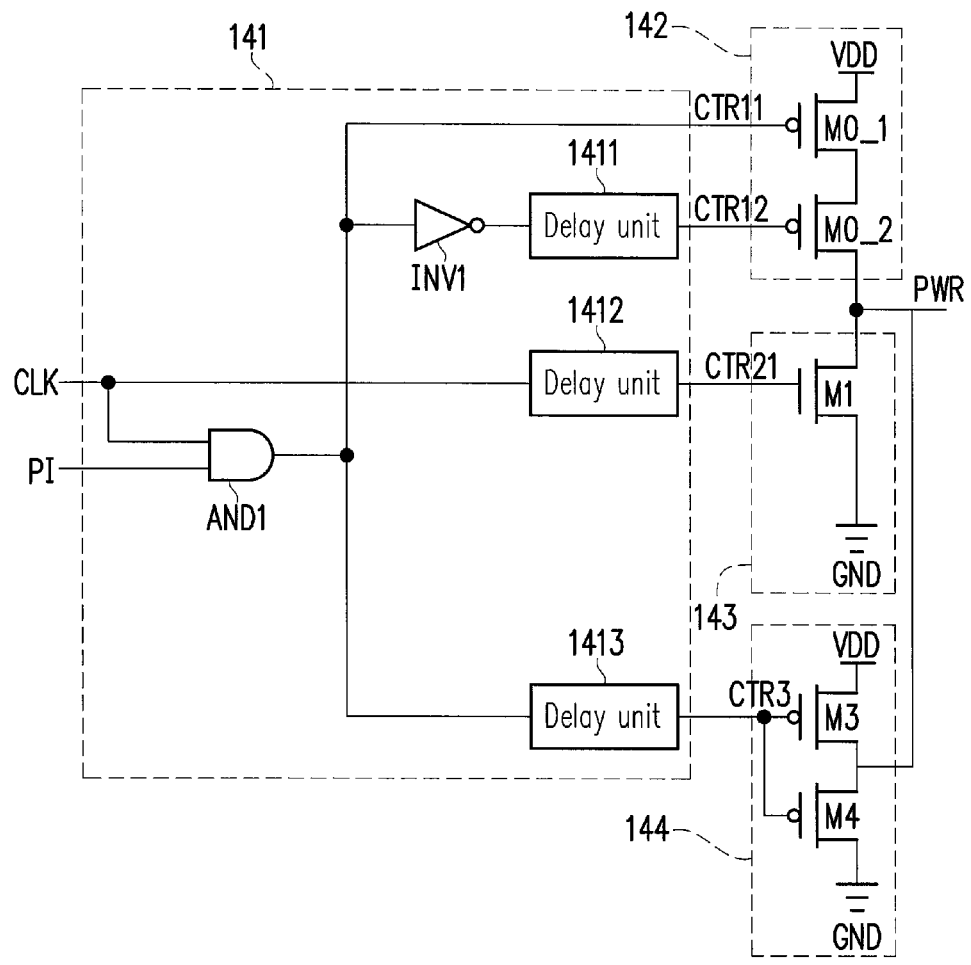
FIG. 3G is a circuit diagram illustrating a sixth implementation of the bit-line voltage controller 140 according to the exemplary embodiment of the present invention.

Referring to FIG. 3G, FIG. 3G is a circuit diagram illustrating a sixth implementation of the bit-line voltage controller 140 according to the exemplary embodiment of the present invention. In the present implementation, the voltage pull-up circuit 142 is constructed by two transistors M0_1 and M0_2, the voltage pull-down circuit 143 is constructed by a single transistor M1, and the voltage keeping circuit 144 is constructed by two P-type transistors M3 and M4. The controller 141 includes an AND gate AND1, an inverter INV1 and three delay unit 1411-1413. Two input terminals of the AND gate AND 1 receive the clock signal CLK and the bank selecting signal PI respectively, and the output terminal of the AND gate AND 1 generates a control signal CTR11. The control signal CTR11 is coupled to the input terminals of the inverter INV1 and the delay unit 1413. The output terminal of the inverter INV1 is coupled to the delay unit 1411, the output terminal of the delay unit 1411 generates a control signal CTR12. The output terminal of the delay unit 1413 generates a control signal CTR3.

The difference in the bit-line voltage controller 140 between the first to fifth implementations previously described and the sixth implementation is that the bit-line voltage controller 140 of the present implementation first pull down the bit-line power PWR by the voltage pull-down circuit 143, and then pull up the bit-line power PWR to an appropriate voltage level of the output voltage by the voltage pull-up circuit 142. In other words, the pull-up time period occurs after the pull-down time period in the present embodiment.

Figure 4:
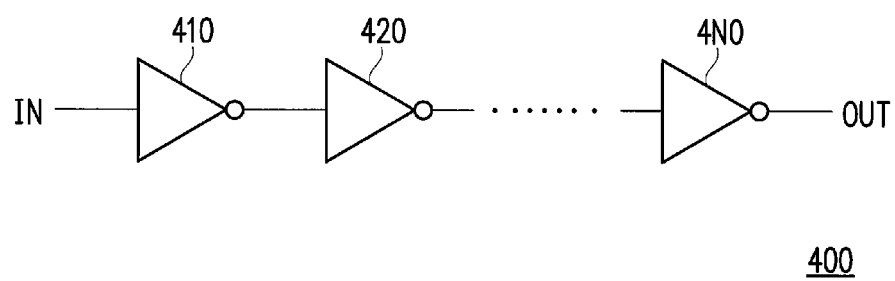
FIG. 4 is a circuit diagram illustrating an implementation of a delay unit 400 according to the exemplary embodiment of the present invention.

Referring to FIG. 4 for following, FIG. 4 is a circuit diagram illustrating an implementation of a delay unit 400 according to the exemplary embodiment of the present invention. The delay unit 400 includes a plurality of inverters 410-4N0. The inverters 410-4N0 interconnects with each other in series. In addition, an input terminal of a first level inverter 410 receives a signal IN, and an output terminal of a last level inverter 4N0 generates a signal OUT. The number of the inverters 410-4N0 may be an even number.

Figure 5A:
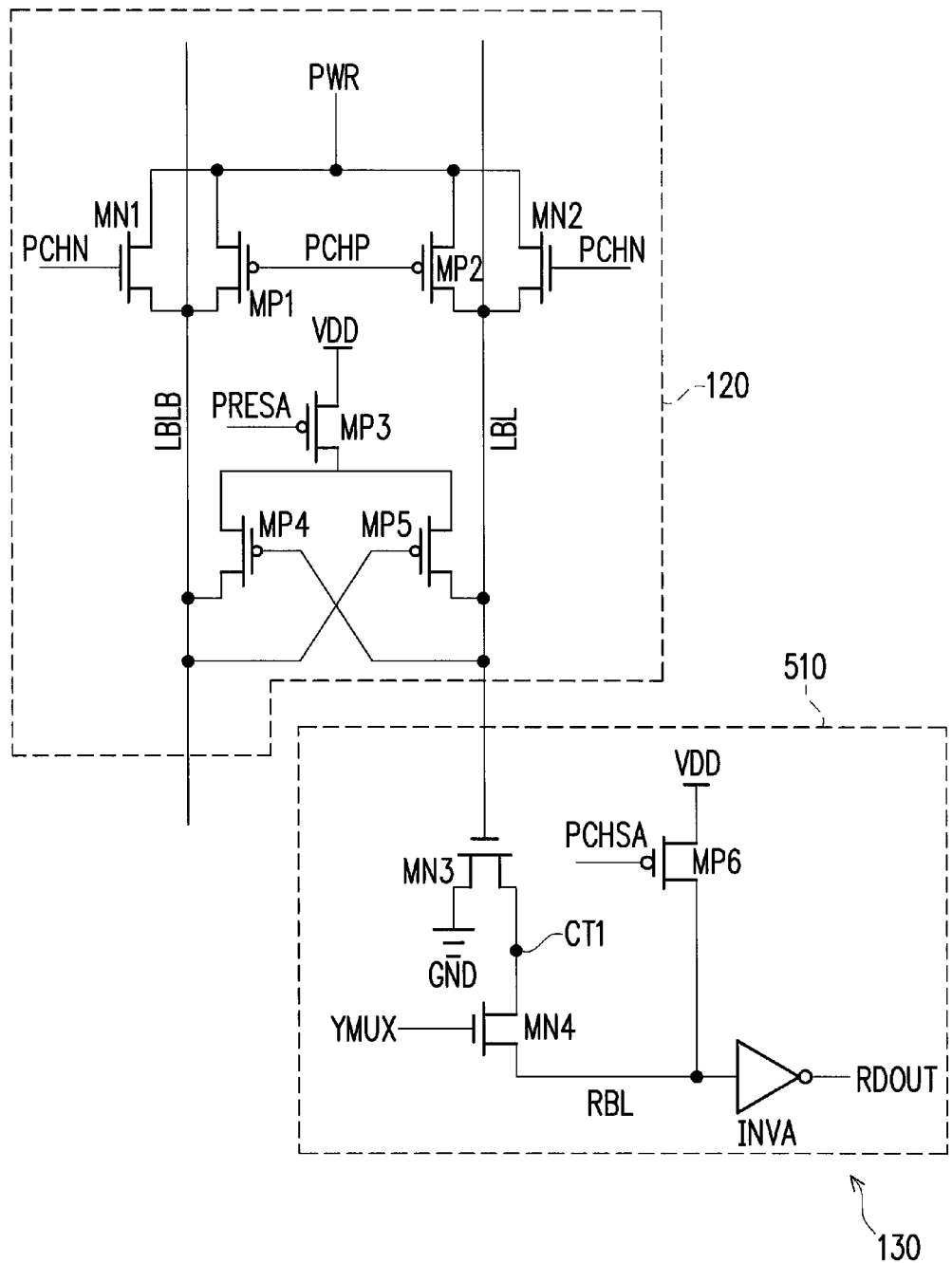
FIG. 5A illustrates an implementation of a bit-line multiplexer 120 and a sensing circuit 130 according to the exemplary embodiment of the present invention.

Referring to FIG. 5 for the following, FIG. 5A illustrates an implementation of the bit-line multiplexer 120 and the sensing circuit 130 according to the exemplary embodiment of the present invention. In the present implementation, the bit-line multiplexer 120 includes a transistor pair constructed by two transistors MN1 and MP1, a transistor pair constructed by two transistors MN2 and MP2 and three transistors MP3, MP4 and MP5. The transistor pair constructed by MN1 and MP1 and the transistor pair constructed by MN2 and MP2 receive the bit-line power PWR, and pre-charge the selected bit-line pairs (two selected bit-lines LBL and LBLB) according to two pre-charge signals PCHN and PCHP. The transistors MP4 and MP5 are coupled with each other by cross coupling, so the voltages of the selected bit-lines LBL and LBLB may reach up to a full swing status promptly.

Notably, the sensing circuit 130 includes a plurality of sensors 510, and one of the sensors 510 is coupled to one of the bit-lines in the bit-line pair (e.g. the bit-line LBL). The sensor 510 includes a data transmission switch constructed by a transistor MN3, a selecting switch constructed by a transistor MN4, a pre-charge switch constructed by a transistor MP6 and a buffer INVA. A first terminal of the transistor MN3 receives the second reference voltage (ground voltage GND), and a second terminal of the transistor MN3 is coupled to a first terminal CT1. A control terminal of the transistor MN3 is coupled to the selected bit-line LBL, and the transistor MN3 is turned on or off according to the data on the selected bit-line LBL.

A first terminal and a second terminal of the transistor MN4 are respectively coupled to the first terminal CT1 and a read bit-line RBL. A control terminal of the transistor MN4 receives a read selecting signal YMUX, and the transistor MN4 is turned on or off according to the read selecting signal YMUX. A first terminal of the transistor MP6 receives the first reference voltage (operation voltage VDD), and a second terminal of the transistor MP6 is coupled to a read bit-line RBL. In addition, a control terminal of the transistor MP6 receives a pre-charge signal PCHSA. The transistor MP6 is turned on or off according to the pre-charge signal PCHSA.

When data is being read, the transistor MP6 pre-charges the read bit-line RBL according to the pre-charge signal PCHSA. Next, the transistor MN3 is turned on or off according to data on the selected bit-line LBL, so as to decide whether the ground voltage GND is to be connected to the first terminal CT 1. In addition, when the transistor MN4 is turned on according to the read selecting signal YMUX, if the transistor MN3 is turned on, the voltage on the read bit-line RBL is pulled down and the buffer INVA generates a readout data as "1". To the contrary, if the transistor MN3 is turned off, the voltage on the read bit-line RBL is kept at a status that is pre-charged and the buffer INVA generates the readout data RDOUT as "0". Wherein, the buffer INVA is an inverter. Furthermore, the transistors MN3 and MN4 are N-type transistors, and the transistor MP6 is a P-type transistor.

Figure 5B:
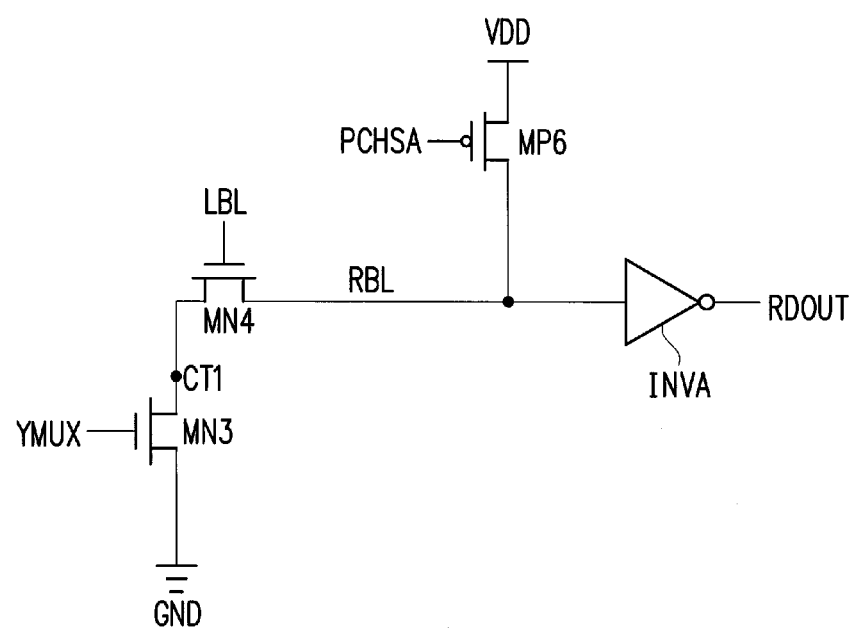
FIG. 5B and FIG. 6A to FIG. 6F illustrate a plurality of implementations of the sensor 510 according to the exemplary embodiment of the present invention.

Furthermore, referring to FIG. 5B, FIG. 5B is a diagram illustrating an alternative implementation of the sensor 510 according to the exemplary embodiment of the present invention. The sensor 510 includes the data transmission switch constructed by a transistor MN4, the selecting switch constructed by the transistor MN3, the pre-charge switch constructed by the transistor MP6 and the buffer INVA. The difference between the present implementation and the implementation of FIG. 5A is at the connection relationship between the data transmission switch and the selecting switch. The first terminal of the transistor MN4, which constructs the data transmission switch, is coupled to the first terminal of the transistor MN3, and the second terminal of the transistor MN4 is coupled to the read bit-line RBL. The control terminal of the transistor MN4 is coupled to the selected bit-line LBL, and the transistor MN4 is turned on or off according to the data on the selected bit-line LBL.

The first terminal and the second terminal of the transistor MN3 that construct the selected switch are respectively coupled to the first terminal CT1 and the ground voltage GND. The control terminal of the transistor MN3 receives the read selecting signal YMUX, and the transistor MN3 is turned on or off according to the read selecting signal YMUX.

Referring to FIG. 6A to FIG. 6F, FIG. 6A to FIG. 6F illustrate a plurality of implementations of the sensor 510 according to the embodiments of the present invention. Wherein, in FIG. 6A, the data transmission switch is constructed by a P-type transistor MP6, the selecting switch is constructed by a N-type transistor MN3, and the pre-charge switch is constructed by a N-type transistor MN4. Furthermore, the pre-charge switch is coupled between the second reference voltage (ground voltage GND) and the read bit-line RBL. In other words, in the present implementation, the read bit-line is pre-charged to the ground voltage GND. In addition, the type of the transistor that constructed the data transmission switch and the type of the transistor that constructed the pre-charge switch must be complementary.

Figure 6A:
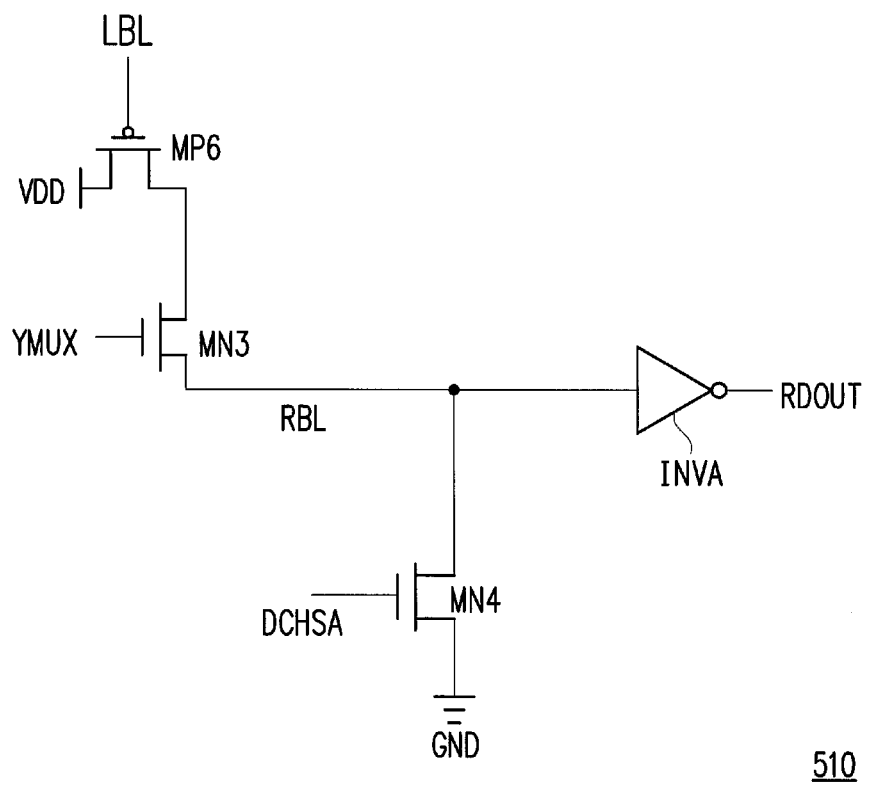
Figure 6B:
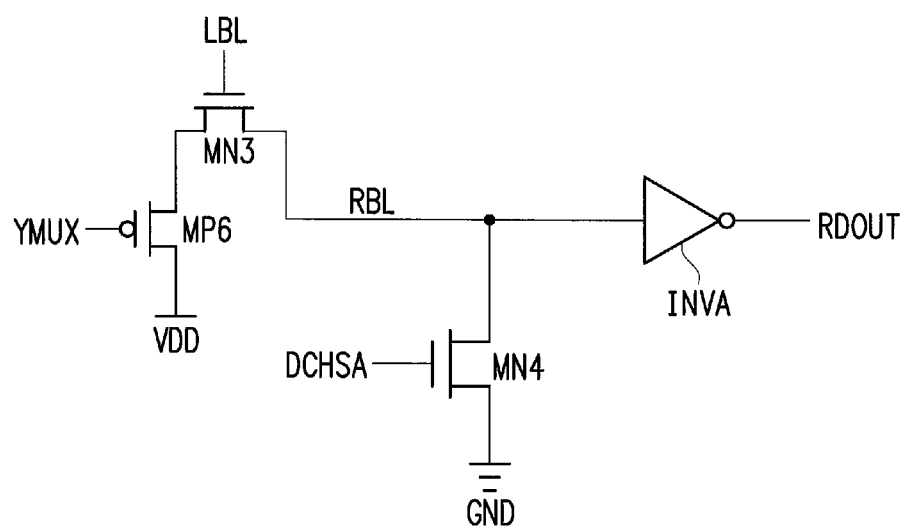

In FIG. 6B, the data transmission switch is constructed by an N-type transistor MN3, the selecting switch is constructed by a P-type transistor MP6, and the pre-charge switch is constructed by a P-type transistor MP7. A first terminal and a second terminal of the transistor MP6 are respectively coupled to a first terminal of the transistor MN3 and the operation voltage VDD. A second terminal of the transistor MN3 is coupled to the read bit-line RBL. The read selecting signal YMUX received by the present implementation is the inversion of the implementation in FIG. 6A.

Figure 6C:
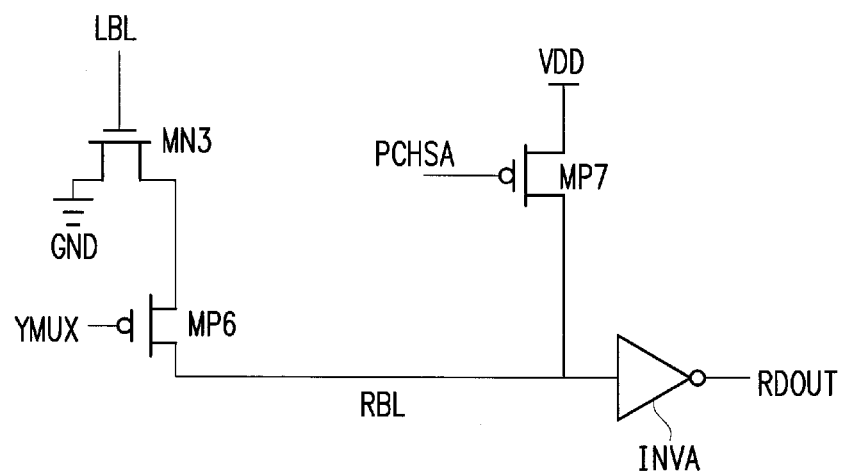
Figure 6D:
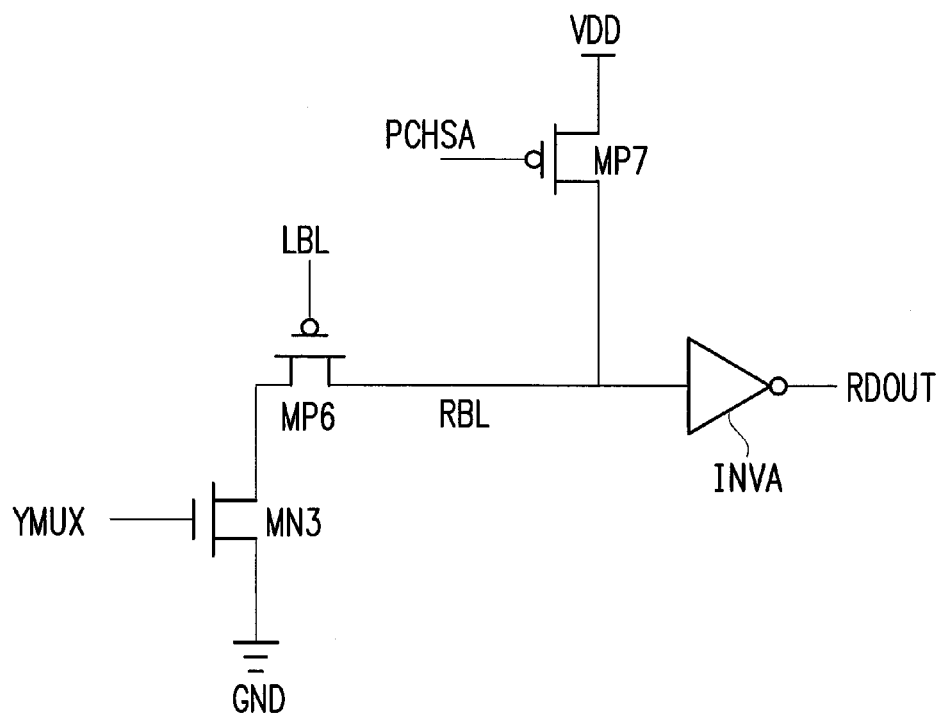

In FIG. 6C, the data transmission switch is constructed by an N-type transistor MN3, the selecting switch is constructed by a P-type transistor MP6, and the pre-charge switch is constructed by a P-type transistor MP7. The read selecting signal YMUX received in the present implementation is inversion of the implementation illustrated in FIG. 6A. In FIG. 6D, the data transmission switch is constructed by a P-type transistor MP6, the selecting switch is constructed by an N-type transistor MN3, and the pre-charge switch is constructed by a P-type transistor MP7.

Figure 6E:
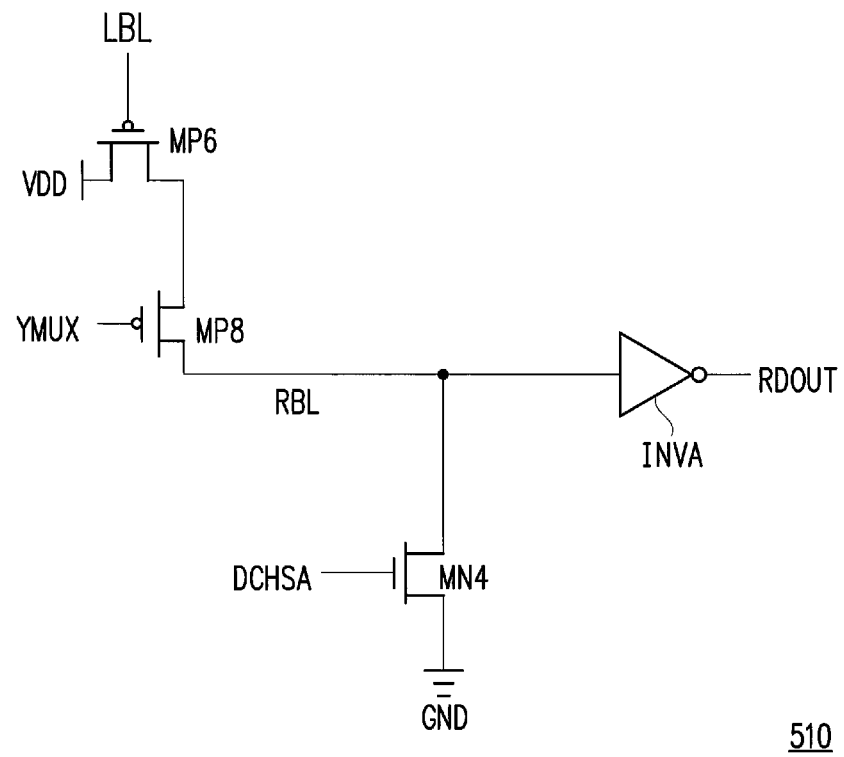
Figure 6F:
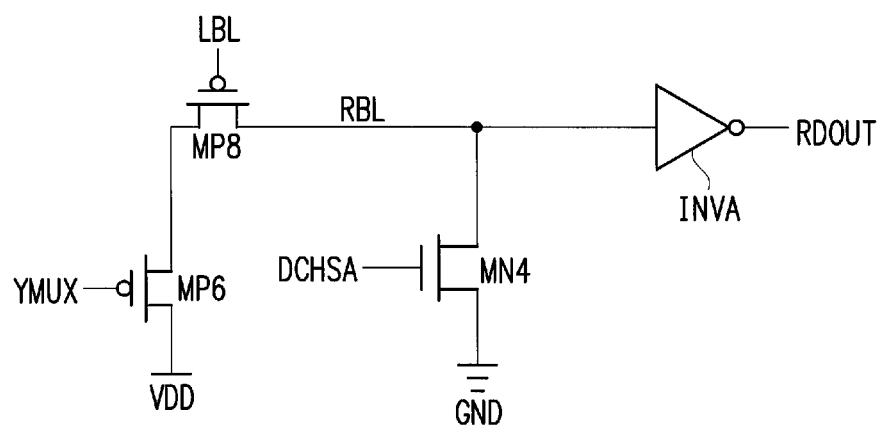

In FIG. 6E, the data transmission switch is constructed by a P-type transistor MP6, the selecting switch is constructed by a P-type transistor MP8, and the pre-charge switch is constructed by an N-type transistor MN4. In addition, in FIG. 6F, the data transmission switch is constructed by a P-type transistor MP8, the selecting switch is constructed by a P-type transistor MP6, and the pre-charge switch is constructed by an N-type transistor MN4.

In summary, the embodiments of the present invention first pulls up and then pull down the voltage of the bit-line power, and the output voltage is kept at an appropriate voltage level. As a result, the voltage of the bit-line power may not generate a huge variation due to the effect of the fabrication parameter drift, and the read effectiveness of the data on the static random access memory apparatus is stabilized effectively.

Although the present invention has been described with reference to the above embodiments, however, the present invention is not limited thereto. It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A bit-line voltage controller, adapted to a static random access memory apparatus, comprising:
a controller, receiving a bank selection signal and a clock signal, and deciding a pull-up time period, a pull-down time period, and a voltage keeping time period according to the bank selection signal and the clock signal;
a voltage pull-up circuit, coupled to the controller, the voltage pull-up circuit pulling up a bit-line power according to a first reference voltage;
a voltage pull-down circuit, coupled to the controller, the voltage pull-down circuit pulling down the bit-line power according to a second reference voltage; and
a voltage keeping circuit, coupled to the controller, the voltage keeping circuit keeping the bit-line power equal to a output voltage during the voltage keeping time period,
wherein, the voltage keeping time period is after the pull-up time period and the pull-down time period.

2. The bit-line voltage controller as claimed in claim 1, wherein the output voltage is between the first reference voltage and the second reference voltage, and the first reference voltage is greater than the second reference voltage.

3. The bit-line voltage controller as claimed in claim 1, wherein the pull-up time period occurs before the pull-down time period, or the pull-up time period occurs after the pull-down time period.

4. The bit-line control circuit as claimed in claim 1, wherein the voltage pull-up circuit comprises:
at least a pull-up transistor, the pull-up transistor have a first terminal, a second terminal, and a control terminal, the first terminal of the pull-up transistor receives the first reference voltage, the control terminal of the pull-up transistor receives a first control signal, and the second terminal of the pull-up transistor is coupled to the bit-line power,
wherein, the controller generates the first control signal within the pull-up time period.

5. The bit-line voltage controller as claimed in claim 4, wherein the voltage pull-down circuit comprises:
at least a pull-down transistor, the pull-down transistor having a first terminal, a second terminal, and a control terminal, wherein the second terminal of the pull-down transistor receives the second terminal voltage, the control terminal of the pull-down transistor receives a second control signal, and the first terminal of the pull-down transistor is coupled to the bit-line power,
wherein, the controller generates the second control signal within the pull-down time period.

6. The bit-line voltage controller as claimed in claim 5, wherein the voltage keeping circuit comprises:
a first transistor, having a first terminal, a second terminal, and a control terminal, wherein the first terminal of the first transistor receives the first reference voltage, the control terminal of the first transistor is coupled to a third control signal, and the second terminal of the first transistor is coupled to the bit-line power; and
a second transistor, having a first terminal, a second terminal, and a control terminal, wherein the second terminal of the second transistor receives the second reference voltage, the control terminal of the second transistor is coupled to the third control signal, and the first terminal of the second transistor is coupled to the bit-line power,
wherein, the controller generates the third control signal within the voltage keeping time period.

7. The bit-line voltage controller as claimed in claim 6, wherein the controller comprises:
a first inverter, receiving the clock signal;
an AND gate, wherein a first input terminal of the AND gate is coupled to an output terminal of the first inverter, a second input terminal of the AND gate receives the bank selecting signal, and an output terminal of the AND gate generates a bit of the second control signal;
a second inverter, receiving the clock signal;
a NOR gate, wherein a first input terminal of the NOR gate is coupled to the output terminal of the AND gate, and a second input terminal of the NOR gate receives the clock signal;
a first delay unit, wherein an input terminal of the first delay unit is coupled to the output terminal of the second inverter, and an output terminal of the first delay unit receives the first control signal;

a second delay unit, wherein an input terminal of the second delay unit is coupled to the output of the NOR gate, and an output terminal of the second terminal of the second delay unit generates yet another bit; and a third delay unit, wherein an output terminal of the third delay unit is coupled to the output terminal of the AND gate, and an output terminal of the third delay generates the third control signal.

8. The bit-line voltage controller as claimed in claim 7, wherein the controller further comprises:

a third inverter, coupled at a coupling path between the third delay unit and the AND gate, wherein an input terminal of the third inverter is coupled to the output of the AND gate, and an output terminal of the third inverter is coupled to the input terminal of the third delay unit.

9. The bit-line voltage controller as claimed in claim 7, wherein the controller further comprises:

a third inverter, wherein an input terminal of the third inverter is coupled to the output terminal of the third delay unit, wherein, the output terminal of the third delay unit generates a bit of the third control signal, and an output terminal of the third inverter generates another bit of the third control signal.

10. The bit-line voltage controller as claimed in claim 6, wherein the controller comprises:

an AND gate, wherein a first input terminal of the AND gate receives the bank selecting signal, and a second input terminal of the AND gate receives the clock signal;

a first inverter, receiving the clock signal;

a second inverter, wherein an input terminal of the second inverter is coupled to an output terminal of the AND gate;

a first delay unit, wherein an input terminal of the first delay unit is coupled to an output terminal of the first inverter, and an output terminal of the first delay unit generates the first control signal;

a second delay unit, wherein an input terminal of the second delay unit is coupled to an output of the second inverter;

a first NOR gate, wherein a first input terminal of the first NOR gate is coupled to an output terminal of the second delay unit, an second input terminal for the first NOR gate is coupled to the input of the second inverter, and an output terminal of the first NOR gate generates the second control signal; and a third delay unit, wherein an input terminal of the third delay unit is coupled to the output terminal of the AND gate, and an output terminal of the third delay unit generates the third control signal.

11. The bit-line voltage controller as claimed in claim 6, wherein the controller comprises:

an AND gate, wherein an input terminal of the AND gate receives the bank selecting signal, another input terminal of the AND gate receives the clock signal, and an output terminal of the AND gate generates a bit of the first control signal;

an inverter, wherein an output terminal of the inverter is coupled to the output terminal of the AND gate;

a first delay unit, wherein an input terminal of the first delay unit is coupled to the output terminal of the inverter, and an output terminal generates another bit of the first control signal;

a second delay unit, wherein an input terminal of the second delay unit receives the clock signal, and an output terminal of the second delay unit generates the second control signal; and a third delay unit, wherein an input terminal of the third delay unit is coupled to the output terminal of the AND gate, and an output terminal of the third delay unit generates the third control signal.

12. A static random access memory apparatus, comprising:

a memory cell array, having a plurality of bit-lines;

a bit-line multiplexer, coupled to the memory cell array, the bit-line multiplexer receiving a bit-line power, and selecting a plurality of selected bit-line pairs out of the bit-lines;

a sensing circuit, coupled to the bit-line multiplexer, sensing data on each of the selected pairs so as to output a readout data; and a bit-line voltage controller, coupled to the bit-line multiplexer, configured to provide the bit-line power, the bit-line voltage controller comprising:

a controller, receiving a bank selection signal and a clock signal, deciding a pull-up time period, a pull-down time period and a voltage keeping time period according to the bank selection signal and the clock signal;

a voltage pull-up circuit, coupled to the controller, wherein the circuit pull-up circuit pulls up a bit-line power according to a first reference voltage within the pull-up time period;

a voltage pull-down circuit, coupled to the controller, wherein the voltage pull-down circuit pulls down the bit-line power according to a second reference voltage within the pull-down time period; and a voltage keeping circuit, coupled to the controller, wherein the voltage keeping circuit keeps the bit-line power to equal to an output voltage during the voltage keeping time period, wherein, the voltage keeping time period is after the pull-up time period and the pull-down time period.

13. The static random access memory apparatus as claimed in claim 12, wherein the sensing circuit comprises a plurality of sensors, the sensors are respectively coupled to one of the selected bit-line pairs, each of the sensors comprises:

a data transmission switch, wherein a terminal of the data transmission switch receives the first reference voltage or the second reference voltage, another terminal of the data transmission switch is coupled to a first terminal, and the data transmission switch is turned on or off according to the data on one of the bit-lines of each of the bit-line pairs;

a selecting switch, coupled between the first terminal and a read bit-line, wherein the selecting switch is turned on or off according to a read selecting signal;

a pre-charge switch, wherein a terminal of the pre-charge switch receives the read bit-line, another terminal of the pre-charge switch is coupled to the first reference voltage or the second reference voltage, and the pre-charge switch is turned on or off according to a pre-charge signal; and a buffer, wherein an input terminal of the buffer coupled to the read bit-line, and an output terminal of the buffer generates the readout data.

14. The static random access memory apparatus as claimed in claim 12, wherein the sensing circuit comprises a plurality of sensors, the sensors are respectively coupled to one of the bit-lines of the selected bit-line pairs, each of the sensors comprises:

a data transmission switch, wherein the data transmission switch is turned on or off according to the data on one of the bit-lines of each of the bit-line pairs, one terminal of the data transmission switch is coupled to a read bit-line;

a selecting switch, wherein a terminal of the selecting switch is coupled to another terminal of the data transmission switch, another terminal of the selecting switch is coupled to the first reference voltage or the second reference voltage, the selecting switch is turned on or off according to a read selecting signal;

a pre-charge switch, wherein a terminal of the pre-charge switch is coupled to the first reference voltage or the second reference voltage, a second terminal of the pre-charge circuit is coupled to the read bit-line, the pre-charge switch is turned on or off according to a pre-charge signal; and a buffer, wherein an input terminal of the buffer is coupled to the read bit-line, and an output terminal of the buffer generates the readout data.

15. The static random access memory apparatus as claimed in claim 12, wherein the output voltage is between the first reference voltage and the second reference voltage, and the first reference voltage is greater than the second reference voltage.

16. The static random access memory apparatus as claimed in claim 12, wherein the pull-up time period occurs before the pull-down time period, or the pull-up time period occurs after the pull-down time period.

17. The static random access memory apparatus as claimed in claim 12, wherein the voltage pull-up circuit comprises:

at least a pull-up transistor, wherein the pull-up transistor has a first terminal, a second terminal, and a control terminal, the first terminal of the pull-up transistor receives the first reference voltage, the control terminal of the pull-up transistor receives a first control signal, and the second terminal of the pull-up transistor is coupled to the bit-line power, wherein, the controller generates the first control signal within the pull-up time period.

18. The static random access memory apparatus as claimed in claim 17, wherein the voltage pull-down circuit comprises:

at least a pull-down transistor, wherein the pull-down transistor has a first terminal, a second terminal, and a control terminal, the second terminal of the pull-down transistor receives the second reference voltage, the control terminal of the pull-down transistor receives a second control signal, and the first terminal of the pull-up transistor is coupled to the bit-line power, wherein, the controller generates the second control signal within the pull-down time period.

19. The static random access memory apparatus as claimed in claim 18, wherein the voltage keeping circuit comprises:

a first transistor, having a first terminal, a second terminal, and a control terminal, wherein the first terminal of the first transistor receives the first reference voltage, the control terminal of the first transistor is coupled to a third control signal, and the second terminal of the first transistor is coupled to the bit-line power; and a second transistor, having a first terminal, a second terminal, and a control terminal, wherein the second terminal of the second transistor receives a second reference voltage, the control terminal of the second transistor is coupled to the third control signal, and the first terminal of the second transistor is coupled to the bit-line power, wherein, the controller generates the third control signal within the voltage keeping time period.

* * * * *